United States Patent [19]

Elings et al.

[11] Patent Number: 4,871,938

[45] Date of Patent: Oct. 3, 1989

[54] POSITIONING DEVICE FOR A SCANNING TUNNELING MICROSCOPE

[75] Inventors: Virgil B. Elings; John A. Gurley, both of Santa Barbara, Calif.

[73] Assignee: Digital Instruments, Inc., Santa Barbara, Calif.

[21] Appl. No.: 206,091

[22] Filed: Jun. 13, 1988

[51] Int. Cl.$^4$ .......................................... H01L 41/08
[52] U.S. Cl. .................................. 310/328; 310/330; 310/366; 310/317
[58] Field of Search ............... 310/317, 316, 323, 328, 310/330-332, 366

[56] References Cited

U.S. PATENT DOCUMENTS

| | | | |
|---|---|---|---|
| 3,720,849 | 3/1973 | Bardocz | 310/328 |
| 3,865,997 | 2/1975 | Halter | 310/328 X |
| 4,087,715 | 5/1978 | Myer | 310/328 X |
| 4,525,852 | 6/1985 | Rosenberg | 310/328 X |
| 4,607,166 | 8/1986 | Tamaki | 310/328 X |
| 4,689,516 | 8/1987 | Yokoyama et al. | 310/328 X |
| 4,723,086 | 2/1988 | Leibovich | 310/328 |

Primary Examiner—Mark O. Budd
Attorney, Agent, or Firm—Charles H. Schwartz; Ellsworth R. Roston

[57] ABSTRACT

A piezoelectric positioning device for controlling the three dimensional horizontal and vertical movement of a tip relative to the sample in a scanning tunneling microscope. A thin walled cone or cylinder shaped member formed of piezoelectric material having an outer surface and an inner surface. A tip member positioned at the bottom of the cone or cylindrical member. A plurality of substantially similar electrode members positioned around one of the surfaces of the cone or cylinder shaped member to form opposite pairs of electrodes to control the horizontal movement of the tip in two of the three dimensions in accordance with voltages applied to the pairs of electrodes. A unitary member positioned around the other of the surfaces of the cone or cylinder shaped member to form a unitary electrode to control the vertical movement of the tip in the third dimension in accordance with voltage applied to the unitary electrode.

35 Claims, 4 Drawing Sheets

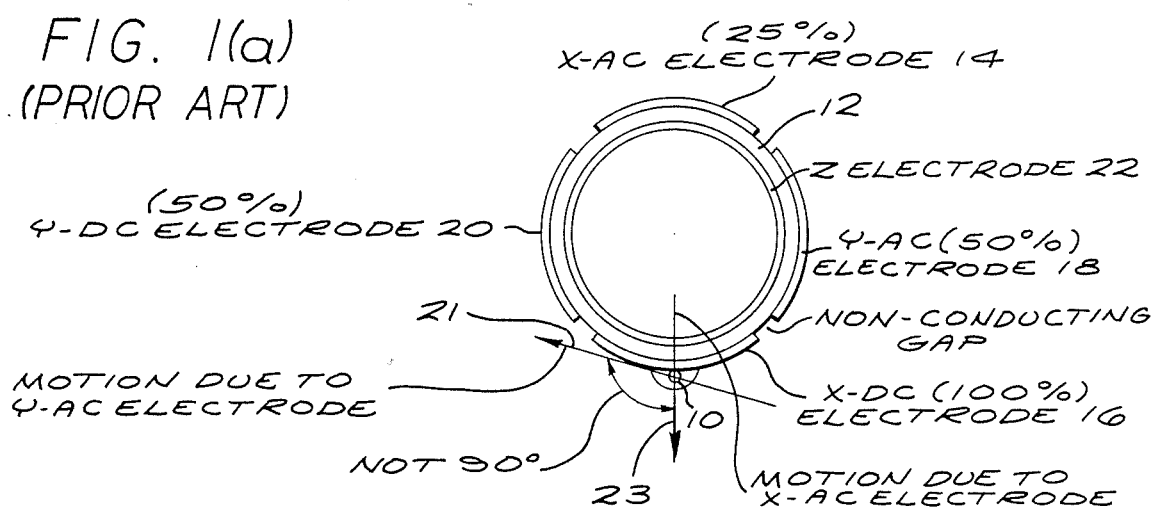
FIG. 1(a) (PRIOR ART)
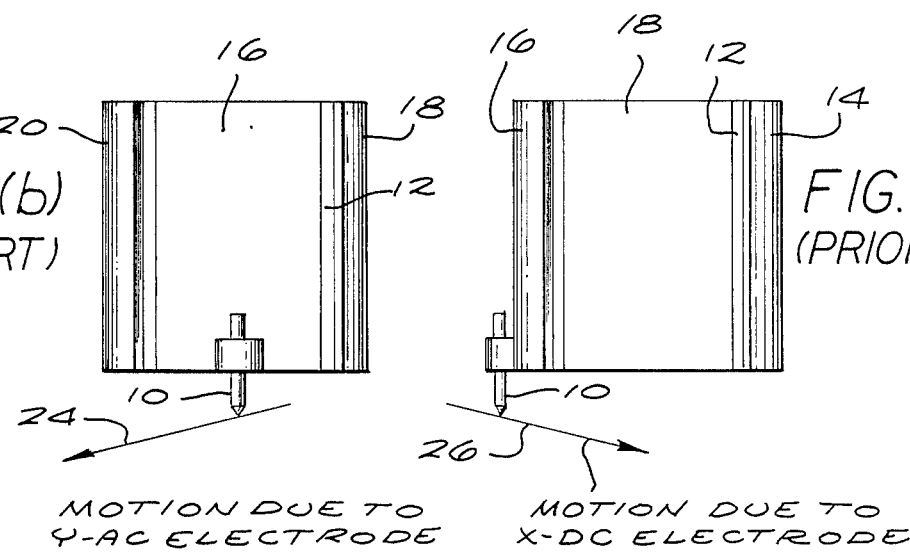
FIG. 1(b) (PRIOR ART)
FIG. 1(c) (PRIOR ART)
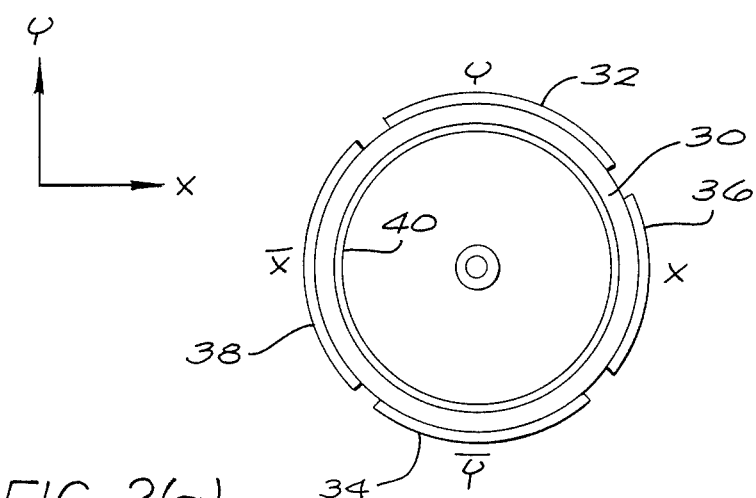
FIG. 2(a)

FIG. 2(b)
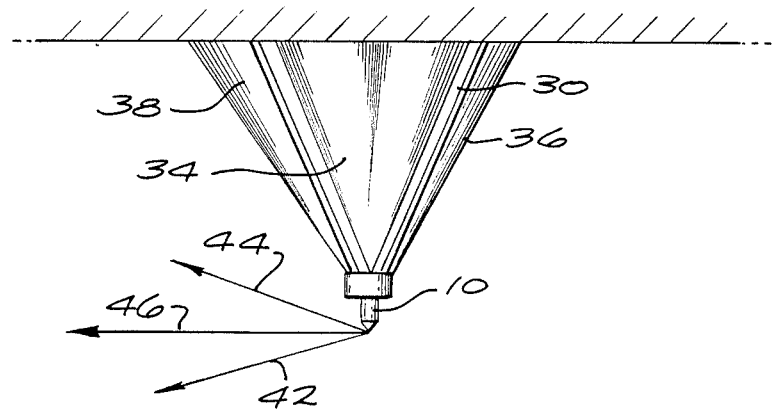
FIG. 3
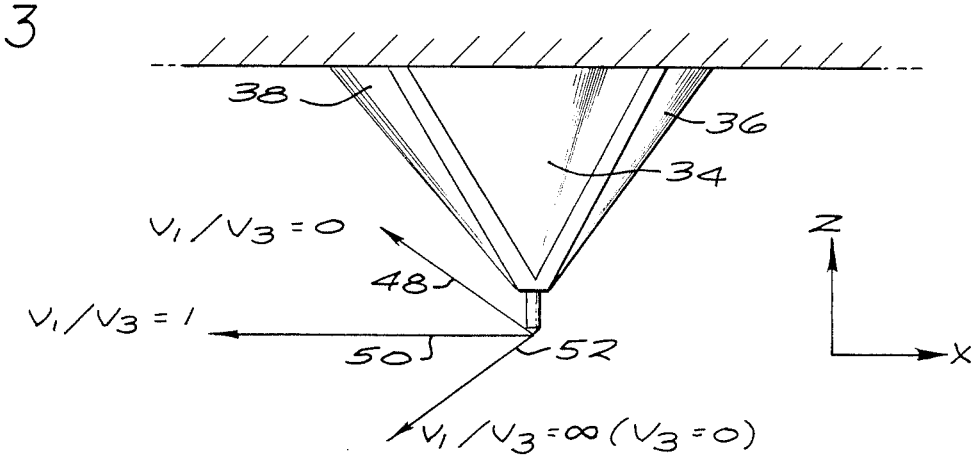
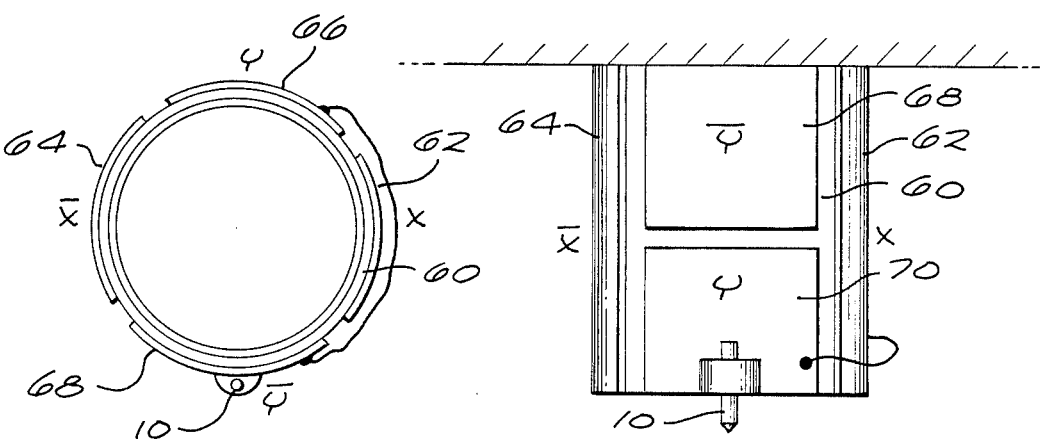
FIG. 4(a)    FIG. 4(b)

POSITIONING DEVICE FOR A SCANNING TUNNELING MICROSCOPE

BACKGROUND OF THE INVENTION

1. Field of the Invention

The present invention relates to improved design of a three dimensional piezoelectric positioning device for controlling the position of a tip member in a scanning tunneling microscope relative to the surface of a sample under observation Specifically, the present invention relates to the overall shape of the piezoelectric device, the electrode arrangement for the piezoelectric device and the mounting of the piezoelectric device.

2. Description of the Prior Art

In general, a scanning tunneling microscope operates by positioning a conducting tip or needle very close to the surface of a conducting sample. In particular, the tip may be held approximately ten angstroms (10 Å) above the surface of the sample and at such a distance, if bias voltage is applied between the sample and the tip, a current referred to as the tunneling current will flow between the sample and the tip. Reference is made to the following article by Hansma and Tersoff, *Journal of Applied Physics,* Jan. 15, 1987 for a recent article giving a current review of scanning tunneling microscopes.

In general, scanning tunneling microscopes include positioning apparatus so as to control the scan of the tip in an XY raster scan over the surface of the sample, while keeping the tip a substantially constant height above the surface. In addition, a feedback loop is established to keep the tunneling current flowing between the tip and the surface constant. The tunneling current is very sensitive to the separation distance and may increase about a factor of five for a five angstrom (5 Å) decrease in the separation.

This rapid change in tunneling current for changes in height provides a very sensitive indicator of the height for use in the feedback loop. Specifically, the feedback loop controls the height of the tip above the surface which control is referred to as the Z axis control. The signal which controls the vertical position or Z axis of the tip may then be used to determine the topography of the sample since the control signal is representative of the height of the surface as a function of the X and Y horizontal coordinates. The topography is, therefore, a function of all three coordinates X, Y and Z and it is important that the positioning device be able to control the tip in three independent orthogonal axis. In this way, the horizontal position and the vertical height can be determined by the control signals applied to the positioning device.

It is also to be appreciated that it is also possible to keep the tip stationary and move the sample with the positioning device in order to perform the scan. The feedback electronics would then keep the distance between the tip and sample constant by moving the sample vertically.

One typical design of a three dimensional positioning device is shown in the article by Binnig and Smith published in the *Review of Scientific Instruments,* August 1986. This article discloses the use of a tube of piezoelectric material with four electrodes o the outside of the tube and one electrode on the inside of the tube. The X and Y scanning of the tip is provided by applying the proper voltages to two of the outside electrodes (referred to as the AC electrodes). X and Y offsets of the tip are provided by grounding or applying high DC voltage to the other two outside electrodes (referred to as the DC electrodes). The vertical Z position of the tip is controlled by applying voltage to the inner electrode.

As shown in the Binnig et al article, the tip is connected to the edge of the tube to keep the mass of the tip mounting as low as possible. It is generally desirable to keep the mass on the end of the tube low so that the resonant frequency of the scanner is high to make the scanner more resistant to vibrations and to allow the scanner to operate at high speed. By applying voltages to the individual outer electrodes to create electric fields between the X and Y electrodes and the inner electrode, the piezoelectric material can expand or contract non-uniformly and cause the tube to bend to move the tip in the horizontal plane. By apply a voltage to the inner electrode the tube expands or contracts uniformly to lower or raise the tip.

A positioning device as described in the Binnig et al article, has a number of problems. In particular, the XY scan directions are not perpendicular and thereby create a raster scan which does not have orthogonal axis. This is because the sensitivity of the outer electrodes for moving the tip varies depending upon the electrode position around the cylinder with respect to the position of the tip. In addition, the positioning device shown in the Binnig et al article has large vertical-horizontal cross coupling.

For example, the vertical motion of the tip varies when the voltage on particular ones of the electrodes varies so that when these particular ones of the electrodes are energized to theoretically provide scanning in the horizontal direction, the height of the tip also varies. Conversely, when the Z electrode voltage is varied, the tube expands or contracts moving the tip not only in the vertical direction, but also in the horizontal direction. It can be seen, therefore, that the Binnig et al prior art positioning device is objectionable since it does not provide a structure with constant sensitivity and having the three scan directions orthogonal and independent and with no cross coupling.

Another similar design for a three dimensional scanning device is shown in the article by Besocke published in *Surface Science* 181 (1987). This scan device is also a tube with four outer electrode and one inner electrode but has the tip mounted in a central position. This, unfortunately greatly increases the tip mass and prevents easy access to the tip but does allow for the elimination of some of the problems with the Binnig et al type of device.

SUMMARY OF THE PRESENT INVENTION

In the present invention, a positioning device is provided which keep the mass on the end of the scanner low, scans along orthogonal axis and has little cross coupling between the three scan directions. The structure of the present invention also has additional advantages such as a larger scan range for given electrode voltages and the ability to cancel sample tilt with a simple electronic adjustment by controlling the YZ or XZ coupling. Specifically, the present invention drives four scan electrodes in a complementary fashion to make g the scan axis perpendicular. Also the electrode arrangement may be used to control electronically the coupling between the horizontal scan and the vertical motion of the tip with respect to the sample. The present invention is described with reference to two specific embodiments one in the form of a cone and the other in the form of a tube or cylinder.

The cone shaped embodiment has the advantages of symmetry, easy access to the tip and a high resonant frequency because of the low mass at the tip end. The cone shaped embodiment may also allow for simple tip mounting and because of the central position, allows the tip to be easily visualized by the operator of the scanning tunneling microscope. In general, the cone is formed of a relatively thin walled material and with four electrodes on the outer surface and one electrode on the inner surface. The conducting tip is mounted at the end or apex of the cone in a tip holder. Voltage may then be applied to pairs of the outer electrodes in a complementary fashion so that the movement of the tip would only be in the horizontal plane and not in the vertical direction.

In order to provide for movement in the Z direction, this may be accomplished by holding the voltage on the outer electrodes constant and varying the voltage on the inner electrode or by providing an equal, but variable voltage to all of the outer electrodes while holding the voltage on the inner electrode constant. This provides for a direct movement of the tip in the Z direction without providing any movement in the X or Y directions. However, it is also possible to provide for a movement in the Z direction by applying voltages to one or more of the outer electrodes in some ratio to control not only movement in the Z direction, but also some movement in the X or Y direction. This type of scanning may be useful depending on the circumstances of the sample and depending upon the other scan control necessary in the positioning device.

A second embodiment for the piezoelectric positioning device is a cylindrical shape. In general, a cylinder is an easier shape to make than a cone and the cylinder may be preferable to the cone because of cost. The cylindrical shape of the present invention includes an electrode configuration which allows the tip to be mounted on either the inside or outside edge of the cylinder, but eliminates the horizontal-vertical coupling. The advantage of mounting the tip on the edge of the cylinder is that it gives a low mass mounting and also places the tip at a position where it is easy to visualize. The tip would be normally mounted on one of the Y scan electrodes to reduce the capacitive pickup on the tip since the Y electrodes scan at a lower frequency than the X electrodes.

In the present invention, the electrode on the side where the tip is mounted is split into at least two electrode portions and normally two of these portions are driven with complementary voltages. It is, therefore, possible by driving the two portions with opposite voltages to substantially eliminate any vertical motion and thereby eliminate coupling between the horizontal and vertical axis. The present invention also provides for minimizing the capacitive coupling between the scanning electrodes and the tip. For example, if the tip is mounted on an electrode driven by a particular scan voltage Y, then any pickup to the tip can be cancelled by coupling an equal but opposite pickup to the complementary electrode through a small capacitor. This can, therefore, provide for a simple method to cancel capacitive pickup on a tip.

Another improvement in the present invention relates to the mounting of the three dimension piezoelectric positioning device as described above. In particular, the scanning structure, such as the tube or cone described above, is mounted in a metal structure and with the metal structure held down magnetically onto three screws which are threaded into a base on which the sample is mounted. The magnetic mounting allows the scanner to be easily replaced by a different scanner, or to remove the same scanner to replace the tip or sample. The magnetic holding of the scanner thereby makes interchangeable scanners of different height and, therefore, different scan ranges.

The present invention may also provide mounting of the piezoelectric scanner to examine the surface of a large sample without having to cut the sample up for measurement. In this type of structure, the scanner is mounted in a support structure and with the support structure resting on the sample to be measured. In both of the mounting structures described, coarse and fine adjusting screws may be used to provide for the initial positioning of the tip relative to the sample. These positioning screws may be controlled using a stepper motor to move the screws in short known increments while the feedback loop is operating so that the mechanical movement can be controlled to a very fine degree. In any event, when a tunneling current is detected by the tip, then the screw adjustment would be terminated and any further vertical movement would be controlled by the Z axis piezoelectric positioner as described above.

BRIEF DESCRIPTION OF THE DRAWING

A clearer understanding of the present invention will be had with reference to the following description and drawings wherein.

FIGS. 1(a), (b) and (c) illustrates a prior art piezoelectric three dimensional positioning device and illustrating the problems with such a device;

FIG. 2a illustrates a top view of a cone shaped scanner in accordance with the teachings of the present invention;

FIG. 2b illustrates a side view of the cone shaped scanner of FIG. 2a and showing the motion in the horizontal plane due to complementary voltages applied to the electrodes;

FIG. 3 illustrates a side view of the cone shaped scanner of FIG. 2a and 2b and illustrating the motion of the tip due to ratios of voltages applied to opposite electrodes;

FIG. 4a is a top view of a cylindrical shaped scanner of the present invention showing the position of the electrodes;

FIG. 4b is a side view of the cylindrical shaped scanner illustrating the splitting of one of the electrodes into two portions;

DESCRIPTION OF THE PREFERRED EMBODIMENTS

Figure 5:
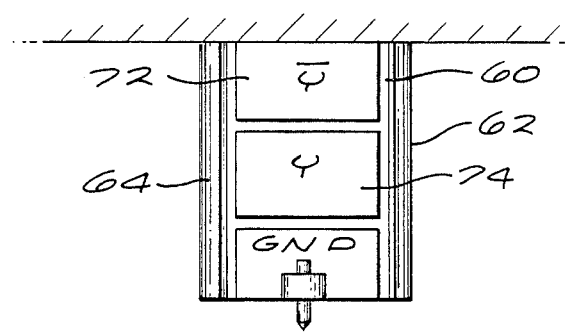
FIG. 5 is a side view of the cylindrical shaped scanner showing one of the electrodes split into three portions.

FIG. 1 illustrates a prior art piezoelectric positioning device for positioning a tip member 10 along three orthogonal axis defined as X, Y and Z. X and Y are in a horizontal plane and Z is in a vertical plane. As shown in FIG. 1, the three dimensional positioning device uses a tube 12 of piezoelectric material with four electrodes on the outside and one electrode on the inside. Specifically, a first pair of electrodes 14 and 16 on the outside of the tube 12 control the X axis motion of the tip, an additional pair of outer electrodes 18 and 20 control the motion on the Y axis and a single electrode 22 on the interior of the tube controls the motion along the Z axis.

As shown in FIG. 1, the tip 10 is connected to the edge of the tube at the bottom of the electrode 16 to keep the mass of the tip mounting as low as possible. It is desirable to keep the mass on the end of the tube 12 low and, therefore, the resonant frequency of the scanner high to make the scanner more resistant to vibrations and to allow the scanner to operate at high speeds. The three dimensional positioning device shown in FIG. 1 is similar to that disclosed in the Binnig and Smith article referenced above.

As described in the Binnig et al article, electrode 14 is referred to as the X-AC electrode, electrode 18 is referred to as the Y-AC electrode, electrode 16 is referred to as the X-DC electrode and electrode 20 is described as the Y-DC electrode. Applying a voltage, whose sign depends upon the polarization of the piezoelectric material, to a single outside electrode causes that segment of the tube 12 to expand or contract perpendicular to the electric field. This causes the tube 12 and thereby the tip 10 to bend perpendicular to the axis of the tube. Orthogonal XY motion is obtained by controlling the voltages on two of the electrodes spaced ninety degrees (90°) apart which would normally be the electrodes 14 and 18. The other two electrodes 16 and 20 can be grounded or used as large amplitude offsets by applying a DC voltage to these electrodes. Motion in the Z direction is obtained by applying voltage to the single inside electrode 22 which causes a uniform expansion or contraction of the tube.

Unfortunately, the X and Y scan directions for the tip are not perpendicular and thereby creates a raster scan which does not have orthogonal axis. This is illustrated in FIG. 1(a) where the motion of the tip 10 for the X and Y axis is shown to be not at 90°. In addition, there is large vertical-horizontal cross coupling so that scanning in the horizontal plane also creates coupling along the vertical axis. Movement in the horizontal plane thereby produces movement along the vertical or Z axis. This phenomena is shown in FIGS. 1(b) and (c).

As shown in FIG. 1(a), the sensitivity of the outer electrodes for moving the tip varies depending upon the position of the electrodes around the cylinder with respect to the position of the tip. For example, electrode 16 is the most sensitive electrode for moving the tip in the horizontal direction since it is the electrode to which the tip is mounted. This is shown in FIG. 1(a) by indicating that the X-DC electrode 16 has a sensitivity of one hundred percent (100%). The electrode on the opposite side of the tip, which is the X-AC electrode 14 has a sensitivity of about twenty five percent (25%) relative to the sensitivity of the electrode 16. The electrodes 18 and 20 each have a sensitivity of about fifty percent (50%) compared with the electrode 16.

The above sensitivity problem exists not only for the electrodes as a whole, but also for portions of the electrodes. For example, the Y electrodes do not in fact move the tip completely in the Y direction because the portion of the electrode nearest the tip 10, in angular relationship around the cylinder, causes more tip motion than the portion of the electrode away from the tip. The net result is that the motion of tip due, for example, to a voltage applied to the Y-AC electrode 18 is not in the Y direction, but at an angle as shown by line 21. The motion due to voltage applied to the X-AC electrode 14 is as shown by line 23.

Similarly, it can be seen that the vertical motion of the tip 10 varies when the voltage, for example, on the X-DC electrode varies, or when the voltage on either of the Y electrodes 18 and 20 is varied. Therefore, when the X offset is varied, or when the Y direction is either scanned or offset, the height of the tip varies as shown by lines 24 and 26 of FIGS. 1(b) and (c). It can be seen that when the cylinder is scanned in the Y direction using the prior art design of FIG. 1, as the tube 12 bends it also moves up or down at the position of the tip mounting so that the tip 10 cannot be scanned in a horizontal plane without also moving the tip in the vertical direction. It can be appreciated, that such a result makes data analysis very difficult to achieve. In addition, when the Z electrode voltage is varied, the tube expands or contracts moving the tip not only in the vertical direction, but also in the horizontal direction because of the change in diameter of the tube 12. It can be seen that these problems with the prior art scanner as shown in FIG. 1 is objectionable since it is preferable to have the three scan directions orthogonal and independent with no cross coupling.

The first embodiment of the present invention is shown in FIG. 2 with a top view in FIG. 2a and a front view in FIG. 2b. The second embodiment of the present invention is shown in FIG. 4 with a top view in FIG. 4a and a front view in FIG. 4b. Both of the embodiments of the present invention are designed to have all three scan directions orthogonal and independent with little or no cross coupling and with the mass on the end of the scanner kept low. The scanners of the present invention also have additional advantages such as a larger scan range for given electric voltages when compared with prior art structures and the ability to cancel sample tilt with a simple electronic adjustment by controlling the YZ or XZ coupling.

In particular, the present invention drives four scan electrodes in a complementary fashion to make the scan axis perpendicular. Also, the electrode arrangement can be used to control electronically the coupling between the horizontal scan and the vertical motion of the tip with respect to the sample. The piezoelectric element could be of any conventional shape with four fold symmetry, but as indicated above in the present invention, two preferred embodiments are disclosed which are a cone shape and a tube shape.

As shown in FIG. 2, the cone shape scanner has the attributes of symmetry, easy access to the tip 10 and a high resonant frequency (high rigidity) because of the low mass at the tip end. The cone shape also allows for simple tip mounting and allows the tip to be easily visualized by the operator.

The motion of the cone 30 is controlled by four electrodes 32, 34, 36 and 38 on the outside surface of the cone and one electrode 40 on the inner surface of the cone 30. As shown in FIG. 2(b), the conducting tip 10 used for tunneling is mounted onto the end or apex of the cone 30 generally in a tip holder which is in turn mounted directly onto the end of the cone It is preferable that the mass of the tip holder and tip be kept low to keep the cone structure very rigid.

Applying an electric field to the piezoelectric material forming the cone 30 causes the material to shrink or expand in various directions depending upon the direction of the field and the direction of the polarization of the material. For the specific example of the present invention, the piezoelectric cone is normally polarized perpendicular to the electrodes through the wall of the cone and voltages applied to the electrodes in turn apply an electric field along this perpendicular direction. The net effect is that the piezoelectric material will expand or shrink, depending on the sign of the applied electric field, in a plane perpendicular to the applied field to thereby control the motion of the tip.

As an example, the voltage on the outer electrodes may be held constant and the voltage on the inner electrode may be varied. This causes the material all around the circumference of the cone to contract or expand incrementally by the same amount. This, in turn, causes the cone to shrink or elongate in diameter and length and, therefore, move the tip in the Z direction but not in the horizontal plane. Since the tip 10 is mounted in the center of the cone 30, the change in diameter of the cone will not move the tip in the X or Y direction.

When voltage to one of the outer electrodes 32 through 38 is varied and with the voltage on the inner electrode 40 kept constant, the piezoelectric material under the particular outer electrode shrinks or expands to cause the cone 30 to bend. For example, as shown in FIG. 2(b), if the voltage on electrode 36 is increased, the piezoelectric material under the electrode 36 expands in the plane parallel to the electrode causing the tip 10 to move down and in the horizontal plane along the X-axis which is away from the electrode 36. This is shown by line 42 in FIG. 2(b). If an equal and opposite voltage change is provided on the electrode 38, this will cause the piezoelectric material under the electrode 38 to contract in the plane of the electrode which causes the tip 10 to move up and also in the horizontal plane along the X axis as shown by the arrow 44 in FIG. 2(b).

Therefore, the net effect of applying equal and opposite voltages to electrodes 30 and 38 is to move the tip 10 only in the horizontal plane along the X axis and not in the vertical direction. The net motion is, therefore, shown by the arrow 46 in FIG. 2b. A reversal of the voltages would cause the tip 10 to move in the horizontal plane, but in the opposite direction to the arrow 46 as shown in FIG. 2(b). A similar action will occur with electrodes 32 and 34 to move the tip 10 in the horizontal plane, but along the Y axis. It can be seen, therefore, by applying voltages in a complementary fashion using electrode pairs, the tip 10 can be scanned in the XY horizontal plane with no vertical motion along the Z axis.

Because the tip is equally spaced from the four electrodes 32 through 38 and because the scan electrodes are driven in a complementary fashion, there is no capacitive pickup on the tip 10 from the scan electrodes even if the scan electrodes are on the inside of the cone. Therefore, the Z electrode 40 could be on the outside of the cone and the four scanning electrodes 32 through 38 could be on the inside of the cone and the scanning action would be the same except for a reversal in the sign of the applied voltages to achieve the desired directional movement.

It is also possible to provide for ratios of voltages applied to the pairs of electrodes so that the tip 10 can be scanned in the X and Y horizontal plane and also provide a proportional amount of motion along the Z axis. For example, this may be desirable to scan a sample which has a tilt to the surface. The ratios of the voltages applied to the pairs of electrodes can be adjusted so that the tip 10 can be made to scan parallel to a tilted surface of the sample.

FIG. 3 illustrates how the tip 10 can move in both the X direction and in the Z direction if the X scan electrodes 36 and 38 are driven with voltages whose ratio is variable. Voltage $V_1$ is applied to electrode 36 and $V_3$ to electrode 38. For example, arrow 48 shows the motion of the tip 10 when the ratio is zero. In this instance the tip 10 moves through an arc with the length of the electrode 36 as the radius since the length of this portion of the scan structure does not change. The motion of the tip 10 along the Z axis compared to the motion in the X direction depends on the aspect ratio of the cone and with shorter cones giving more Z-X coupling than longer cones. As the ratio of the voltages on the pair of electrodes 36 and 38 increases, the motion along the Z axis decreases and with the motion along the Z axis going to zero when the ratio is one. This of course is the situation when equal and opposite voltages are applied to the pair of electrodes. This is shown by the arrow 50. As the ratio continues to increase to infinity, then the motion changes to the direction as shown by the arrow 52 in FIG. 3

It is to be appreciated that the control circuitry to vary the ratio of the scan voltages can be anything from very simple circuitry, such as potentiometers, to vary the two voltages separately or as complicated as computer analog outputs to control the scan voltages separately. For example, a computer can be programmed to provide outputs to vary the scan voltage ratio to provide for a particular coupling between the horizontal and vertical axis, but at the same time also varying the absolute value of the voltages to keep the motion, such as along the horizontal axis, the same distance to thereby control the size of the ultimate visual image of the sample surface.

As indicated above, the control of the YZ and XZ coupling may be very useful when the tip 10 must follow a sloped surface. Because the present invention can scan relatively large areas compared to the vertical resolution, small slopes become large slopes when the vertical axis is blown up to look for fine atomic detail. The slope removal would normally be accomplished by a computer which is processing the image, but this obviously requires computation time on all the incoming data and thereby tends to slow down the data taking. Using the electrode system of the present invention, the computer can adjust the scan voltages to scan the tip along the surface so that the slope does not show up in the data. The actual data, of course, is the voltage applied to the Z electrode to keep the tip a constant height above the surface. In this way the slope is taken out of the data before it gets to the computer so that the computer does not have to spend valuable time removing the slope from all of the data. This has the result of speeding up the data taking and the provision of the output image.

It is also to be appreciated that the motion along the Z axis may be accomplished by adding an equal voltage to all the outer electrodes while keeping the voltage of the inner electrode constant. This has the advantage that the inner electrode may always be kept at ground voltage to provide a shield for any wire attached to the tip 10 which passes the tunneling current from the tip to the remaining portion of the system. There is a disadvantage to this type of system in that it complicates the electronics and limits the X, Y and Z ranges.

It should be noted that a cone shape for the scanner or any shape in which the cross section decreases towards the ti, such as a pyramid shape, is stiffer in the X and Y directions than a cylinder for the same length. In general, the resonant frequency of a structure mounted on one end decreases as its center of mass moves away from the mounting. The center of mass of a cone is only one third ($\frac{1}{3}$) of its length away from the base and the center of mass of the cylinder is one half ($\frac{1}{2}$) its length. The cone also provides a way of mounting the tip in the center of the scanning piezoelectric element without adding much mass. This mounting in the center coupled with the electrodes which are driven in a complementary fashion to provide for symmetry in X and Y makes the scan axis perpendicular and eliminates the horizontal-vertical coupling. The greater stiffness also allows the cone scanner to operate at higher frequencies than a cylindrical scanner.

Typically, the scanner is rigidly mounted at one end as shown in FIG. 2b and 3 so the deflection at the tip end is effected mostly by the portion of the scan electrodes which are near the mounted end. This is because any bending of the scanner at the mounted end has a long lever arm for moving the tip end of the scanner. In a cylinder, the electrodes near the tip end and the mass which they control are not useful for the deflection of the tip, but do contribute to lowering the stiffness of the structure. Also, if the tip is mounted in the center of the cylinder, the edges of the cylinder may interfere with the operator being able to visualize the tip for placement over the sample.

Specifically, the edges get in the way of visualizing the tip, get in the way of putting any necessary fluids on the sample and get in the way of perhaps bombarding the sample with an electron or laser beam. In the cone shape scanner the tip is of course easily visualized and accessible. In practice the cone would normally be truncated at the end as shown in FIGS. 2(b) and 3. This is to facilitate manufacturing and to allow for the mounting of the tip on the end.

Although a cone shape scanner is desirable for the reasons given above, a cylinder is a much easier shape to manufacture than a cone and in many cases, the cylindrical shaped scanner would be preferable because of cost. However, as indicated above, mounting the tip in the center of the cylinder creates a number of problems. In the present invention a cylindrical embodiment is shown that includes a specific electrode configuration to allow the tip to be mounted on either the inside or outside edge of the cylinder, but eliminates horizontal-vertical coupling. The advantage of mounting the tip on the edge of cylinder is that it gives a low mass mounting and places the tip in a position where it is easily visualized and accessible.

The cylindrical embodiment of the invention is shown in FIGS. 4(a) and (b) wherein the tip 10 is shown mounted on the outside of the cylinder. Specifically, a piezoelectric cylindrical element 60 has mounted on the outside of the cylinder, a plurality of the outside electrodes including a pair of X electrodes 62 and 64, and a pair of Y electrodes including a single Y electrode 66 and a split Y electrode formed of electrode portions 68 and 70. In addition, a Z electrode 72 is provided on the inside of the cylinder 60. The tip 10 is mounted at the bottom of the Y electrode portion 70 and as shown in FIGS. 4(a) and 4(b), the upper Y electrode portion 68 would have applied a voltage of one polarity while the electrode 66 in combination with the electrode portion 70 would have applied an opposite polarity. The tip 10 is mounted on one of the Y electrodes to reduce the capacitive pickup on the tip since the Y electrodes normally scan at a lower frequency than the X electrodes. Again, it should be noted that the Z electrode could be on the outside and the scan electrodes on the inside but with the configuration as shown in FIGS. 4(a) and 4(b).

The embodiment of the present invention using a cylinder provides the split electrode on the side where the tip is mounted and with the split electrode formed by at least two electrode portions and with these two electrode being driven with complementary voltages. As shown in FIG. 4(b), the size of the two electrode portions is approximately the same since the horizontal division is in the center.

In the conical structure as shown in FIG. 2, the tip 10 would not move vertically when scanned in the Y direction if complementary voltages were used because the tip was in the center of the scanner. However, this is not true with the prior art structure as shown in FIG. 1 using four outside scan electrodes on the cylindrical surface and with the tip mounted on the edge. As indicated above, the tip when scanned in the Y direction also moves vertically. This vertical motion is eliminated in the present invention as shown in FIG. 4 if the two split electrode portions 68 and 70 are driven with opposite voltages so that the vertical expansion or contraction caused by the upper part is cancelled by the opposite contraction or expansion of the lower part. The use of the split electrode portions decreases the sensitivity of the scanning in the Y direction, but not to a great degree since the top portion 68 is more sensitive at scanning the tip 10 then the bottom portion 70. However, both portions are equally effective at moving the tip in the vertical direction so there is a trade off of a small loss of scanning efficiency for a complete elimination of the YZ coupling.

In a cylindrical structure in which the diameter and height of the cylinder are approximately equal and without using the split electrode portions, the scanning in the Y direction is about twenty percent (20%) greater than in the X direction when equal scanning voltages are used in the X and Y directions. After splitting the electrode into two, as shown in FIG. 4(b), and when driving the two electrode portions 68 and 70 with complementary voltages to eliminate the YZ coupling, the scanning in the Y direction is approximately ten percent (10%) less than in the X direction. In this way, the use of the split electrode portions not only eliminates the YZ coupling, but also helps to equalize the scanning sensitivity in the X and Y directions. In one case the difference is twenty percent (20%) while in the case for the split electrode portions, the difference is approximately ten percent (10%).

It should be noted that the electrode on the side of the cylinder on which the tip is mounted may be split into more than two electrode portions and an example with three electrode portions is shown in FIG. 5. These electrode portions are identified by reference numerals 72, 74 and 76. As shown in FIG. 5, the bottom electrode may be coupled to ground to reduce capacitive coupling between the scanning electrodes, which are normally driven at large voltage, and the tip 10 through which very small tunneling currents are flowing. The top electrode portion 72 and middle electrode portion 74 are driven with complementary voltages in a similar manner to that shown in the embodiment of FIG. 4. The top and middle electrode portions 72 and 74 cancel the vertical motion of the tip 10 and the bottom electrode portion 76 contributes no vertical motion during scanning so there is no net vertical motion of the tip when the tip is scanned in the Y direction. In a similar manner as to that disclosed with reference to the conical structure of the FIGS. 2 and 3, the coupling between X and Z and Y and Z can be controlled electrically on the cylindrical scanner of FIGS. 4 and 5 by varying the ratio of the complementary scan voltages.

It is important that the scanners of the present invention minimize the capacitive coupling between the scanning electrodes and the tip. The reason for this is that the scanning electrodes are driven by voltages in the hundreds of volts and the tip is conducting a tunneling current which is sometimes only a fraction of a nanoamp. Any capacitive coupling could allow the scanning electrodes to induce a small current in the tip which could be greater than the current being measured.

The electrode of major concern is the one on which the tip is mounted since the coupling from this electrode will be the strongest. One way of minimizing the coupling is to have the tip mounted on a electrode which is scanning slowly, which is the Y electrode. This is normally because the induced current is proportional to the frequency of the signal which is capacitively coupled to the tip. In some applications it is useful to be able to scan the tip fast in either the X or Y direction and in this situation the coupling between the electrode on which the tip is mounted and the tip should be eliminated if possible.

Figure 9A:
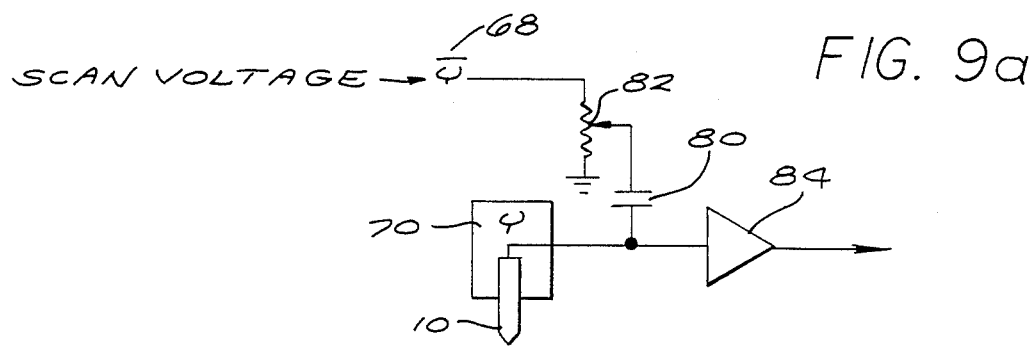
FIG. 9a is a circuit diagram of a simple circuit for use in cancelling capacitive coupling on the tip.

The present invention which uses complementary scan voltages on the electrodes may also provide for a simple method for cancelling any capacitive pickup on the tip. Specifically, FIG. 9a illustrates a first circuit which may be used to cancel the pickup to the tip. The cancellation is accomplished by coupling to the tip an equal but opposite pickup from the complementary electrode. As shown in FIG. 9a, the voltage from the complementary electrode 68 is coupled through a very small capacitor 80 to the tip mounted on the other electrode 70. The specific voltage level may be controlled by a potentiometer 82 and with the adjustment of the potentiometer providing the specific amount of the complementary voltage which is needed to drive the capacitor 80 to cancel out any capacitive coupling to the tip 10.

Figure 9B:
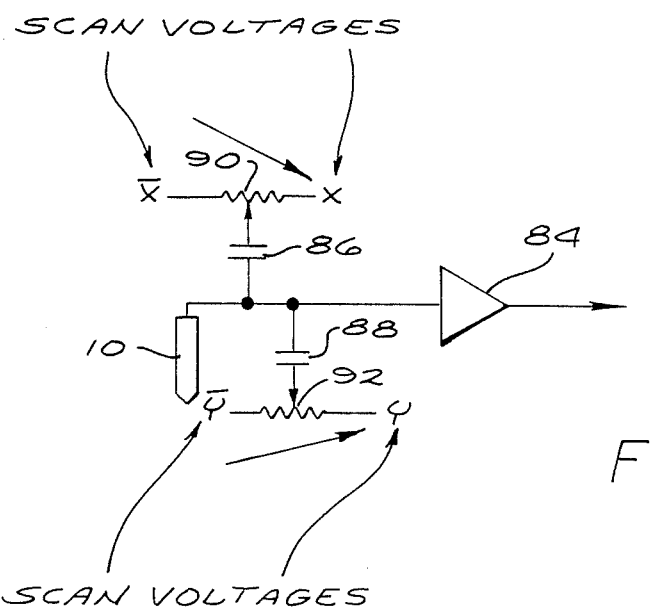
FIG. 9b is a circuit diagram of an all inclusive circuit for cancelling capacitive coupling on the tip.

Since the complementary voltage has the same magnitude and frequency as the voltage applied to the electrode 70 on which the tip is mounted, when the adjustment of the potentiometer 82 is proper, this will provide for complete cancellation of all scan frequencies and voltages. In general, the capacitive coupling to the tip 10 would be due to the geometry of the mounting of the tip 10 on the electrode 70 and the adjustment of the potentiometer 82 would have to be provided very infrequently and in theory only once. The input to a preamplifier 84 which receives the tunneling current from the tip 10 should, therefore, be free of any capacitive pickup. The circuit of FIG. 9a would be sufficient for a symmetrical scanner, such as the conical scanner of FIG. 2, but at times it might be desirable to cancel out all possible capacitive coupling FIG. 9b illustrates an all inclusive circuit including coupling complementary voltages provided to both the X and Y electrodes so as to cancel out any capacitive pickup which might be the result of any asymmetry in the position of the tip or any error in design or manufacturing. Specifically, two very small capacitors 86 and 88 receive voltages applied through two potentiometers 90 and 92 and with the opposite ends of the potentiometers receiving respectively the complementary voltages for the X electrodes and the Y electrodes. It can be seen that this circuit will provide for complete elimination of any capacitive coupling which could result in an error in the tunneling current produced by the tip 10 to the preamplifier 84. It should be noted that the size of the capacitors 86 and 88 are very small (such as one to ten picofarads) so that the presence of these capacitors will not effect the speed of the input to the preamplifier 84.

Using the circuit and method of cancelling as present in FIG. 9b, either set of electrodes may be used for the fast direction and the tip may be scanned in any direction as determined by the operator without any problem of capacitive coupling. For example, the voltage on the X and Y electrodes could be varied simultaneously at the same rate so as to scan the tip at a forty five degree (45°) angle with respect to the electrodes. In this way, any angle of the raster scan may be performed without concern for capacitive pickup so as to enhance the visualization of artifacts in the image.

As a further extension of the present invention, a simple and stable mounting system is provided to mount the scanning crystal above the sample. The scanner, which is shown to be either the cone or cylindrical scanning structures is illustrated in dotted lines 30 and 100 in FIG. 5. It is to be appreciated that the scanner also could be any other symmetrical shape. The scanner 30 or 100 is mounted in a metal support member, such as a cylinder 102, and with the metal support member 102 resting on three screw members 104 which are threaded through a base member 106. The base member 106 supports the sample 108 which is under observation by the scanning tunneling microscope including the scanner 30 or 100.

Each screw member incorporates a small yet powerful magnet 110 and with a ball bearing 112 retained in position by the magnets 110. The magnets also provide for the support member 102 being held down in a stable mounting position for operation of the microscope. It is to be appreciated that the magnets themselves may form the outer ball surface, but in general it is simpler to use the ball bearings since they are readily available and provide for a hard accurate surface which would be more difficult to achieve if the magnets had to be formed with an outer ball surface.

The use of the magnetic mounting allows the scanner to be easily replaced by a different scanner assembly and also to be easily removed so as to replace the tip or sample. The magnetic holding of the scanner thereby allows for the use of scanners of different heights and therefore different scan ranges.

For example, short scanners are very stable and are used for atomic resolution images. Longer scanners are used for large scans which involve the measurement of surface roughness with a measurement of relatively large structures such as defraction gratings or optical and magnetic dishes. In general, the horizontal scan range of the scanner is proportional to the square of the height of the scanner and the vertical range Z of the scanner is proportional to the height.

In order for the tunneling microscope to be versatile and thereby to be used for a variety of different purposes, it is important that these different types of scanners be quickly interchanged onto a very stable mounting. The present invention includes the magnetic mounting to provide for such a quick change and, as an example, scanners have been interchanged having scan ranges of 0.6, 1.5 and 5 microns using the same basic mounting structure.

The support member 102 is preferably made form a nickel steel such as Invar. This material has been found to be particularly appropriate since it has a thermal expansion coefficient similar to that of the piezoelectric scanner 30 or 100 and also because it is magnetic and, therefore, is held down by the magnets 110 without adding additional material. However, it is to be appreciated that it would also be possible to use a nonmagnetic material, such as stainless steel or ceramic, for the support member 102 and to use a layer of ferro magnetic material on the bottom of the support member for attraction by the magnets 110. It should be noted, however, that the matching of the thermal expansion coefficients of the scanner 30 or 100 and support structure 102 is advantageous because the scanner has a small vertical operating range of typically one micron. Any mismatching of thermal expansion between the scanner and the support greater than one micron could pull the tip out of tunneling range or push the tip into the sample.

Figure 7:
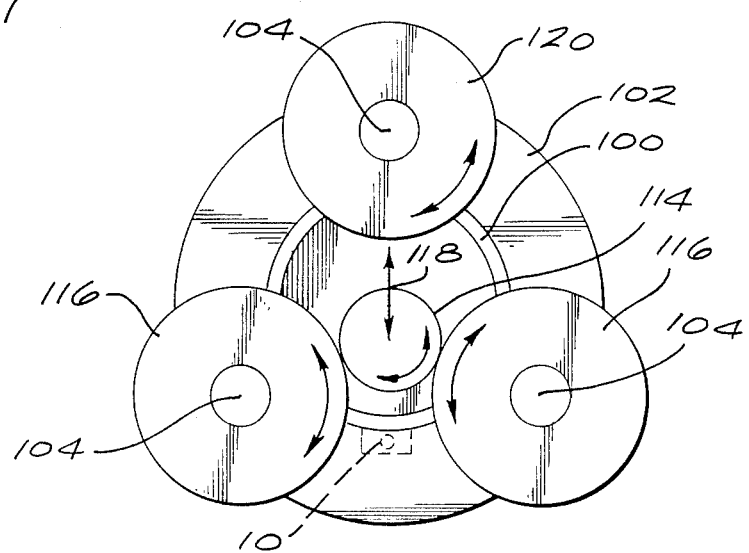
FIG. 7 is a bottom view of the mounting structure of FIG. 6.

In order to operate the tunneling microscope, the tip 10 must be put near the surface with the three screws 104. By adjusting the height of the screws, the entire support member 102 including the tip 10 may be moved close to the sample 108. FIG. 7 illustrates a bottom view of the mounting system including a stepper motor 114 which may be moved into engagement with either a pair of large wheels 116 mounted at the bottom of two of the screws 104 or a single wheel 120 mounted at the end of the third one of the screws 104. The movement of the stepper motor 114 to the two positions is shown by the arrow 118. When the tip is put into tunneling range of the surface the vertical driver in the scanner structure 30 or 100 can then take over to provide for the micropositioning of the tip relative to the surface of the sample.

It is also possible to provide for coarse and fine adjustment of the screws by using an ordinary 400 step per revolution stepper motor. The stepper motor may be run rapidly in the full step mode for coarse adjustment until the tip is visually observed to be close to the sample and then in a half step mode to give 800 steps per revolution for fine adjustment. It is also possible to provide for even finer steps either by gearing the motor, or by using drive electronics which provide even finer control of the stepper motor. The stepper motor can, therefore, be adjusted quickly between the pair of screws and the single screw to bring the tip down into the tunneling position and into the vertical range of the scanner itself with very little time delay.

The use of the stepper motor has other advantages. For example, by single stepping the stepper motor the tip can be moved vertically in known increments while the feedback loop for controlling the tunneling current is operating. This allows the operator to measure the voltage increments placed on the Z electrode by the feedback electronics to compensate for the tip motion caused by the individual known steps produced by the stepper motor. In this way, a calibration of the vertical sensitivity of the scanner in angstroms per volt may be provided by dividing the known incremental motion of the tip caused by the stepper motor by the voltage increments on the Z electrode. The voltage increments are caused by the feedback electronics to compensate for the motion caused by the stepper motor which is necessary to keep the distance between the sample and the tip constant.

Figure 6:
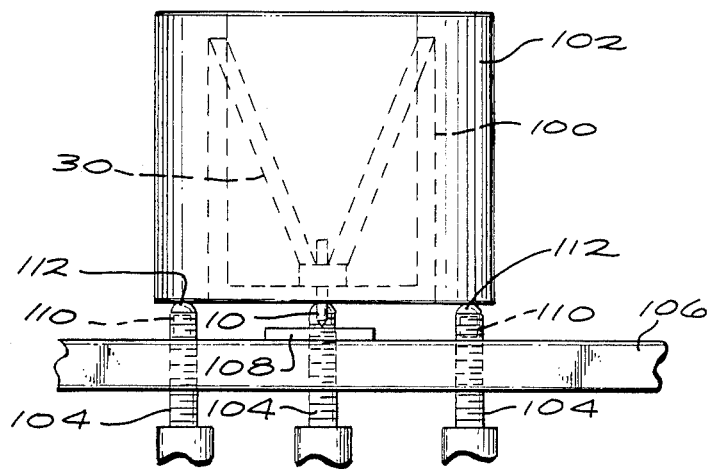
FIG. 6 is a first embodiment of the mounting structure illustrating the cylindrical or cone scanner mounted for measuring a sample.

As an alternative to the mounting structure shown in FIGS. 6 and 7, it is sometimes useful to examine the surface of a large sample without having to cut the sample up for measurement. This may be accomplished by providing for the mounting structure to be included completely within the scanner support. Specifically as shown in FIG. 8, the scanner 30 or 100 may be mounted in the support member 102 as shown in FIG. 6, but with the screws 104 extending through the support member 102 Similarly, the ends of the screws 104 may include the ball members 112 which are held in position by magnets 110.

Figure 8:
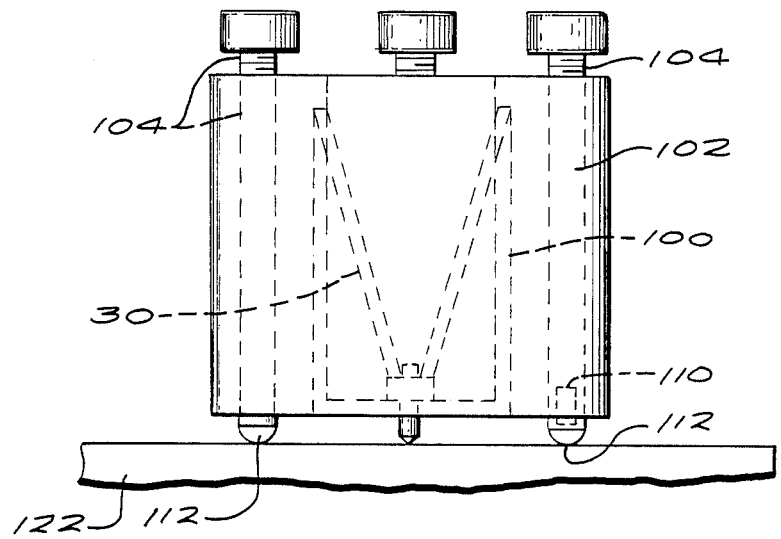
FIG. 8 is a side view of a second mounting structure for mounting a scanner device on a large sample surface.

The arrangement of FIG. 8 allows the scanner to be mounted directly on the surface of a large sample 122 and with a measurement made of the topography of the surface of the sample 122. The support member 102 would hold itself on the sample 122 with gravity or magnetically if the sample were a ferromagnetic material. In this way the scanner is portable so it can be placed on samples in situ. For example, in a manufacturing process, the scanner could actually be part of the quality control to provide for an indication of the surface finish of a part in a manufacturing line.

It is to be appreciated that with both the structures of FIGS. 6 and 8 the screw members may have finer or coarser threads and with all of the screw members not necessarily having the same fineness or coarseness. In that way different ones of the screw members may provide for a finer adjustment. In addition, instead of screws it would be possible to use sliding rods and with the rods being moved manually or with piezoelectric linear motion devices. In all of these situations either using a piezoelectric linear motion device or a stepper motor, the movement of the structures is automatically stopped when a tunneling current is detected by the tip 10 and then the scanning piezoelectric device completes the vertical micropositioning of the tip.

It can be seen, therefore, that the present invention is directed to a piezoelectric positioning device for a scanning tunneling microscope and to support structures for supporting the piezoelectric positioning device relative to a sample. The piezoelectric positioning or scanning device provides for scanning along three independent orthogonal axis and with little or no cross coupling between the scanning in the three different directions. The mounting of the scanning device is simply maintained using a support structure positioned on three ball members and with both coarse and fine positioning provided by the ball members and with the final positioning provided by the vertical positioning in the piezoelectric device.

Although the invention has been described with reference to a particular embodiment, it is to be appreciated that various adaptations and modifications may be made and the invention is only to be limited by the appended claims.

We claim:

1. A piezoelectric positioning device for controlling the three dimensional horizontal and vertical movement of a tip relative to the sample in a scanning tunneling microscope, including
- a thin walled cone shaped member formed of piezoelectric material having an outer surface and an inner surface,
- a tip member positioned at the apex of the cone member,
- a plurality of substantially similar pie shaped members positioned around one of the surfaces of the cone shaped member to form opposite pairs of electrodes to control the horizontal movement of the tip in two of the three dimensions in accordance with voltages applied to the pairs of electrodes, and
- a unitary member positioned around the other of the surfaces of the cone shaped member to form a unitary electrode to control the vertical movement of the tip in the third dimension in accordance with voltage applied to the unitary electrode.

2. The piezoelectric positioning device of claim 1 wherein the pairs of electrodes are positioned around the outside surface of the cone shaped member and the unitary electrode is positioned around the inside surface of the cone shaped member.

3. The piezoelectric positioning device of claim 1 wherein each pair of electrodes has complementary voltages applied to substantially eliminate horizontal-vertical coupling during horizontal movement.

4. The piezoelectric positioning device of claim 1 wherein each pair of electrodes has voltages applied in a particular ratio to provide a predetermined horizontal-vertical coupling during movement.

5. The piezoelectric positioning device of claim 1 wherein a variable voltage applied to the unitary electrode produces a corresponding variable vertical movement of the tip.

6. The piezoelectric positioning device of claim 1 wherein a constant voltage applied to the unitary electrode in combination with a variable voltage applied to all of the pairs of electrodes produces a corresponding variable vertical movement of the tip.

7. The piezoelectric positioning device of claim 1 wherein the cone shaped member is mounted in a support member including at least one area of ferromagnetic material and wherein the sample is positioned on a structure and wherein the structure includes a plurality of upwardly extending members located adjacent the sample to receive the support member to position the tip above the sample and with at least one of the upwardly extending members including magnetic material to attract and hold the ferromagnetic material and thereby the support member and tip in position for scanning.

8. The piezoelectric positioning device of claim 7 wherein the support member is made of a material with a thermal expansion coefficient similar to that of the cone shaped member.

9. The piezoelectric positioning device of claim 7 wherein the upwardly extending members are formed as screw members which may be raised and lowered to in turn raise and lower the support member to position the tip in scanning tunneling range of the vertical movement of the positioning device.

10. The piezoelectric positioning device of claim 9 additionally including a stepper motor to control the operation of the screw members.

11. The piezoelectric positioning device of claim 10 wherein the stepper motor provides course and fine adjustment of the screw members.

12. The piezoelectric positioning device of claim 10 wherein the stepper motor provides individual steps to calibrate the vertical movement of the positioning device.

13. The piezoelectric positioning device of claim 1 additionally including a compensation circuit for cancelling out capacitive pickup to the tip by coupling through at least one capacitor at least a portion of at least one of the voltages applied to the pairs of electrodes to the tip.

14. A piezoelectric positioning device for controlling the three dimensional horizontal and vertical movement of a tip relative to a sample in a scanning tunneling microscope, including
- a thin walled cylindrical shaped member formed of piezoelectric material having an outer surface and an inner surface,
- a tip member positioned on the cylindrical shaped member at a particular position around the circumference of the member,
- a plurality of substantially similar rectangular shaped members positioned around one of the surfaces of the cylindrical shaped member to form opposite pairs of electrodes to control the horizontal movement of the tip in two of the three dimensions in accordance with voltages applied to the pairs of electrodes and with one rectangular electrode of the opposite pairs at the particular position of the tip member split into at least two electrode portions and with opposite polarity voltages applied to the at least two electrode portions to minimize horizontal-vertical cross coupling during horizontal movement and
- a unitary member positioned around the other of the surfaces of the cylindrical shaped member to form a unitary electrode to control the vertical movement of the tip in the third dimension in accordance with voltage applied to the unitary electrode.

15. The piezoelectric positioning device of claim 1 wherein the on rectangular electrode is split into two cylindrical shaped member 16. The piezoelectric positioning device of claim 1 wherein the tip is mounted on the inner surface of the cylindrical shaped member.

17. The piezoelectric positioning device of claim 1 wherein the one rectangular electrode is split into two electrode portions and with the tip positioned adjacent one of the electrode portions and the polarity of the voltage applied to the other electrode portion opposite to the polarity of the voltage applied to the one electrode portion and the opposite rectangular electrode to the split rectangular electrode.

18. The piezoelectric positioning device of claim 1 wherein the pairs of electrodes are positioned around the outside surface of the cylindrical shaped member and the unitary electrode is positioned around the inside surface of the cylindrical shaped member.

19. The piezoelectric positioning device of claim 1 wherein each pair of electrodes has complementary voltages applied to substantially eliminate horizontal-vertical coupling during horizontal movement.

20. The piezoelectric positioning device of claim 1 wherein each pair of electrode has voltages applied in a particular ratio to provide a predetermined horizontal-vertical coupling during movement.

21. The piezoelectric positioning device of claim 1 wherein a variable voltage applied to the unitary electrode produces a corresponding variable vertical movement of the tip.

22. The piezoelectric positioning device of claim 1 wherein a constant voltage applied to the unitary electrode in combination with a variable voltage applied to all the pairs of electrodes produces a corresponding variable vertical movement of the tip.

23. A piezoelectric positioning device for controlling the three dimensional horizontal and vertical movement of a tip relative to a sample in a scanning tunneling microscope, including
- a thin walled cylindrical shaped member formed of piezoelectric material having an outer surface and an inner surface,
- a tip member positioned on the cylindrical shaped member at a particular position around the circumference of the member,
- a plurality of substantially similar rectangular shaped members positioned around one of the surfaces of the cylindrical shaped member to form opposite pairs of electrodes to control the horizontal movement of the tip in two of the three dimensions in accordance with voltages applied to the pairs of electrodes,
- a unitary member positioned around the other of the surfaces of the cylindrical shaped member to form a unitary electrode to control the vertical movement of the tip in the third dimension in accordance with voltage applied to the unitary electrode, and
- the cylindrical shaped member mounted in a support member including at least one area of ferromagnetic material and wherein the sample is positioned on a structure and wherein the structure includes a plurality of upwardly extending members located adjacent the sample to receive the support member to position the tip above the sample and with at least one of the upwardly extending members including magnetic material to attract and hold the ferromagnetic material and thereby the support member and tip in position for scanning.

24. The piezoelectric positioning device of claim 23 wherein the support member is made of a material with a thermal expansion coefficient similar to that of the cylindrical shaped member.

25. The piezoelectric positioning device of claim 23 wherein the upwardly extending members are formed as screw members which may be raised and lowered to in turn raise and lower the support member to position the tip in scanning tunneling range of the vertical movement of the positioning device.

26. The piezoelectric positioning device of claim 25 additionally including a stepper motor to control the operation of the screw members.

27. The piezoelectric positioning device of claim 26 wherein the stepper motor provides course and fine adjustment of the screw members.

28. The piezoelectric positioning device of claim 26 wherein the stepper motor provides individual steps to calibrate the vertical movement of the positioning device.

29. The piezoelectric positioning device of claim 1 additionally including a compensation circuit for cancelling out capacitive pickup to the tip by coupling through at least one capacitor at least a portion of at least one of the voltages applied to the pairs of electrodes to the tip.

30. A portable piezoelectrical positioning device for controlling the three dimensional horizontal and vertical movement of a tip relative to a sample in a scanning tunneling microscope, including
- a three dimensional piezoelectric scanner for producing horizontal and vertical motion in accordance with applied voltages,
- a tip member mounted on the piezoelectric scanner and with three dimensional motion of the tip member controlled by the scanner,
- a support member receiving and supporting the piezoelectric scanner for positioning relative to a sample,
- the support member including a plurality of outwardly extending members located adjacent to the tip for providing a plurality of legs to position the support member and thereby the tip and scanner down on or over the sample to provide portability of the piezoelectric positioning device, and
- wherein the support member is held down on or over the sample by magnetic attraction.

31. The portable piezoelectric positioning device of claim 30 wherein the support member is made of a material with a thermal expansion coefficient similar to that of the piezoelectric scanner.

32. The portable piezoelectric position device of claim 30 wherein the magnetic attraction is provided by magnets located in the outwardly extending members.

33. The portable piezoelectric positioning device of claim 30 wherein the outwardly extending members are screw members which may be raised and lowered to in turn raise and lower the support member to position the tip in scanning tunneling range of the vertical motion of the scanner.

34. A portable piezoelectric positioning device for controlling the three dimensional horizontal and vertical movement of a tip relative to a sample in a scanning tunneling microscope, including
- a three dimensional piezoelectric scanner for producing horizontal and vertical motion in accordance with applied voltages,
- a tip member mounted on the piezoelectric scanner and with three dimensional motion of the tip member controlled by the scanner,
- a support member receiving and supporting the piezoelectric scanner for positioning relative to a sample,
- the support member including a plurality of outwardly extending members located adjacent to the tip for providing a plurality of legs to position the support member and thereby the tip and scanner down on or over the sample to provide portability of the piezoelectric positioning device, and
- the scanner having a piezoelectric cone shaped base member with the tip mounted at the apex and with horizontal motion produced by complementary voltages applied to pairs of opposite electrodes on one surface of the cone shaped base member and with vertical motion produced by a voltage applied to a unitary electrode on the other surface of the cone shaped base member.

35. A portable piezoelectrical positioning device for controlling the three dimensional horizontal and vertical movement of a tip relative to a sample in a scanning tunneling microscope, including
- a three dimensional piezoelectric scanner for producing horizontal and vertical motion in accordance with applied voltages, a tip member mounted on the piezoelectric scanner and with three dimensional motion of the tip member controlled by the scanner, a support member receiving and supporting the piezoelectric scanner for positioning relative to a sample, the support member including a plurality of outwardly extending members located adjacent to the tip for providing a plurality of legs to position the support member and thereby the tip and scanner down or over the sample to provide portability of the piezoelectric positioning device, and the scanner having a piezoelectric cylindrical shaped base member with the tip mounted on the circumferential surface of the cylinder and with horizontal motion produced by complementary voltages applied to pairs of opposite electrodes on one surface of the cylindrical shaped base member and with one electrode of one of the pairs split into electrode portions and with complementary voltages applied to the electrode portions and with vertical motion produced by a voltage applied to a unitary electrode on the other surface of the cylindrical shaped base member.

* * * * *

UNITED STATES PATENT AND TRADEMARK OFFICE
CERTIFICATE OF CORRECTION

PATENT NO. : 4,871,938

DATED : OCTOBER 3, 1989

INVENTOR(S) : VIRGIL B. ELINGS and JOHN A. GURLEY

It is certified that error appears in the above-identified patent and that said Letters Patent is hereby corrected as shown below:

Column 16, line 42, change "1" to --14--;

line 45, change "1" to --14--;

line 48, change "1" to --14--;

line 56, change "1" to --14--;

line 61, change "1" to --14--;

line 65, change "1" to --14--.

Column 17, line 1, change "1" to --14--;

line 5, change "1" to --14--.

Signed and Sealed this

Twenty-third Day of July, 1991

Attest:

HARRY F. MANBECK, JR.

Attesting Officer     Commissioner of Patents and Trademarks